United States Patent
Qureshi (10) Patent No.: US 11,677,207 B2
(45) Date of Patent: Jun. 13, 2023

(54) CONTINUOUSLY TUNABLE BOOSTER OPTICAL AMPLIFIER-BASED FIBER RING LASER COVERING L AND EXTENDED L BANDS

(71) Applicant: KING FAHD UNIVERSITY OF PETROLEUM AND MINERALS, Dhahran (SA)

(72) Inventor: Khurram Karim Qureshi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 17/716,086

(22) Filed: Apr. 8, 2022

(65) Prior Publication Data

US 2023/0105403 A1    Apr. 6, 2023

Related U.S. Application Data

(60) Provisional application No. 63/251,815, filed on Oct. 4, 2021.

(51) Int. Cl.
*H01S 3/067*    (2006.01)
*H01S 3/083*    (2006.01)

(52) U.S. Cl.
CPC ........ *H01S 3/06791* (2013.01); *H01S 3/0677* (2013.01); *H01S 3/06704* (2013.01); *H01S 3/083* (2013.01)

(58) Field of Classification Search
CPC ............. H01S 3/06791; H01S 3/06704; H01S 3/0677; H01S 3/083
See application file for complete search history.

(56) References Cited

U.S. PATENT DOCUMENTS

| | | | | |
|---|---|---|---|---|
| 5,504,771 A | * | 4/1996 | Vahala | ................ H01S 3/06791 372/6 |
| 8,441,721 B2 | * | 5/2013 | White | ................ H01S 3/06754 359/337 |

(Continued)

FOREIGN PATENT DOCUMENTS

| | | |
|---|---|---|
| CN | 104993362 A | 10/2015 |
| CN | 106207724 A | 12/2016 |

(Continued)

OTHER PUBLICATIONS

Young-Geun Han, et al., "Flexible all fiber Fabry-Perot filters based on superimposed chirped fiber Bragg gratings with continuous FSR tunability and its application to a multiwavelength fiber laser", Optics Express, vol. 15, No. 6, Mar. 19, 2007, pp. 2921-2926.

*Primary Examiner* — Xinning(Tom) Niu
(74) *Attorney, Agent, or Firm* — Oblon, McClelland, Maier & Neustadt, L.L.P.

(57) ABSTRACT

A fiber optic ring laser, and non-transitory computer readable medium for using a fiber optic ring laser are disclosed. The disclosed fiber optic ring laser includes a semiconductor booster optical amplifier (BOA), as a gain medium; a Fiber Fabry Perot Tunable Filter (FFP-TF), as a wavelength selection element; an optical isolator (ISO) to insure unidirectional operation of the fiber optic ring laser; and a polarization controller (PC) for attaining an optimized polarization state in order to achieve a stable-generated output in terms of output power and wavelength, wherein the BOA, the FFP-TF, the ISO and the PC are coupled to form a ring configuration that implements a continuously tunable booster amplifier-based fiber ring laser.

7 Claims, 9 Drawing Sheets

(56) References Cited

U.S. PATENT DOCUMENTS

| | | | | |
|---|---|---|---|---|
| 9,019,998 B1* | 4/2015 | Qureshi | ............... | H01S 5/142 |
| | | | | 372/6 |
| 2006/0187537 A1* | 8/2006 | Huber | ............... | H01S 3/106 |
| | | | | 359/337.22 |
| 2011/0069722 A1* | 3/2011 | Lobo Ribeiro | ......... | H01S 5/141 |
| | | | | 372/6 |
| 2014/0098412 A1* | 4/2014 | Welford | ............... | H01S 5/0287 |
| | | | | 359/344 |
| 2018/0248334 A1* | 8/2018 | Ummy | ............... | H01S 3/06787 |

FOREIGN PATENT DOCUMENTS

| | | | | |
|---|---|---|---|---|
| CN | 108666859 A | | 10/2018 | |
| KR | 101510584 B1 * | | 4/2015 | ......... H01S 3/06783 |

* cited by examiner

CONTINUOUSLY TUNABLE BOOSTER OPTICAL AMPLIFIER-BASED FIBER RING LASER COVERING L AND EXTENDED L BANDS

CROSS-REFERENCE TO RELATED APPLICATION

The present application claims benefit of priority to U.S. Provisional Application No. 63/251,815 having a filing date of Oct. 4, 2021, which is incorporated herein by reference in its entirety.

STATEMENT OF PRIOR DISCLOSURE BY AN INVENTOR

Qureshi, K.K., "A Continuously Tunable Booster Optical Amplifier-Based Fiber Ring Laser Covering L and Extended L Bands, Fiber and Integrated Optics," 39:4, 203-211, (2020) DOI: 10.1080/01468030.2020.1829753.

BACKGROUND OF THE INVENTION

Technical Field

The present disclosure relates to a continuously tunable booster optical amplifier-based fiber ring laser covering L and extended L bands.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Due to intensive Internet usage and increased demand in network capacity, wavelength-division multiplexing (WDM) is often employed in access networks that provide fiber-to-the-home (FTTH) access to the Internet. WDM is a technique of modulating numerous data streams, i.e., optical carrier signals of varying wavelengths of laser light onto a single optical fiber. A tunable fiber laser is a laser that is configured to tune for emission of different wavelengths, in which the wavelength can be tuned (i.e., adjusted). Tunable fiber laser is essential for replacing different laser transmitters for different operating wavelengths and generating constant output power across a broad range of wavelengths. Due to impressive performance, tunable fiber lasers are getting more popular in the fields of fiber optic sensing, military and differential absorption spectroscopy, instruments testing, microwave photonics, and optical communications (dense wavelength division multiplexing (DWDM)). Conventional tunable fiber lasers are implemented with mechanical or temperature tuning to change the cavity length to tune the wavelength. The conventional tunable fiber lasers fail to provide stable and accurate turning in terms of power and frequency.

A fiber laser consists of a gain medium and a wavelength selective component, either in a linear or in a ring arrangement. Conventionally, a continuously tunable semiconductor fiber laser operating in C and L bands is used, where the tuning is achieved by incorporating a chirped Fiber Bragg grating (FBG). Existing configurations using three semiconductor optical amplifiers (SOAs) acting as gain media in a nested ring architecture have been used where the laser could be tuned in C-band at room temperature. In some configurations, a wavelength-tunable self-injected reflective SOA (RSOA) based laser uses of Faraday rotator mirror (FRM) as a reflective element in a linear cavity.

These conventional tunable fiber lasers are prone to various problems such as misalignment, environmental sensitivity, and extraneous modes. Hence, there is a need for a tunable fiber laser that provides enhanced output power, side mode suppression ratio (SMSR), and stability.

SUMMARY

In an exemplary embodiment, a fiber optic ring laser is disclosed which includes a semiconductor booster optical amplifier (BOA), as a gain medium; a Fiber Fabry Perot Tunable Filter (FFP-TF), as a wavelength selection element; an optical isolator (ISO) to insure unidirectional operation of the fiber optic ring laser; a polarization controller (PC) for attaining an optimized polarization state in order to achieve a stable-generated output in terms of output power and wavelength, wherein the BOA, the FFP-TF, the ISO, and the PC are coupled to form a ring configuration that implements a continuously tunable booster amplifier-based fiber ring laser.

In another exemplary embodiment, a fiber optic ring laser is disclosed. The fiber optic ring laser includes a semiconductor booster optical amplifier (BOA), as a gain medium; a Fiber Fabry Perot Tunable Filter (FFP-TF) as a wavelength selection element; an optical isolator (ISO) to insure unidirectional operation of the fiber optic ring laser; and a polarization controller (PC) for attaining an optimized polarization state in order to achieve a stable-generated output in terms of output power, wherein an output of the BOA is coupled to an input of the FFP-TF, which in turn is coupled to a fiber coupler, which in turn is coupled to the ISO, which in turn is coupled to the PC, which in turn is coupled to the BOA to form a ring configuration that implements a continuously tunable booster amplifier-based fiber ring laser, and wherein the continuously tunable booster amplifier-based fiber ring laser operates in L band/extended L band spectrum.

In another exemplary embodiment a non-transitory computer readable storage medium having computer program code stored thereon, the computer program code, when executed by one or more processors implemented on a continuously tuning booster optical amplifier (BOA)-based fiber ring laser, causes the continuously tuning a booster optical amplifier (BOA)-based fiber ring laser (fiber ring laser) to perform a method. The method includes receiving an input from optical isolator (ISO) by a polarization controller (PC), wherein the ISO insures unidirectional operation of the fiber ring laser. The method further includes generating an optimized polarization state for an output of the PC in order to achieve a stable-generated output in terms of output power and wavelength by the polarization controller (PC), based on the input received from the ISO. The method further includes amplifying the output of the PC, by the BOA, wherein the BOA is a single pass traveling wave amplifier that is operable to amplify single and multi-wavelength signals. The method further includes selecting a wavelength of the amplified output of the BOA, by a Fiber Fabry Perot Tunable Filter (FFP-TF), in L band/extended L band spectrum. The method further includes generating, by a fiber coupler, a laser output by coupling the selected wavelength of the FFP-TF to the fiber coupler.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms refer to ranges that include the identified value within a margin of 10% or preferably 5%, and any values therebetween.

Aspects of the present disclosure are directed to a continuously tunable booster amplifier (BOA) based fiber optic ring laser. The disclosed fiber optic ring laser utilizes a semiconductor booster optical amplifier (BOA) as a gain medium and a Fiber Fabry Perot tunable filter (FFP-TF) as a wavelength selection element in a ring configuration to achieve continuously tunable laser, operating in L and extended L bands at room temperature. The semiconductor BOA offers many advantages when compared to the existing fiber-based amplifiers. The semiconductor BOA is compact, lightweight, efficient, electrically pumped, easily mass-produced, and easily integrated with other Indium Phosphide (InP) based optical components, thereby making the semiconductor BOA is an attractive substitute for fiber-based products. The disclosed semiconductor BOA offers a 3 dB gain bandwidth of around 80-90 nm compared to the existing fiber-based amplifier offering a bandwidth of around 40-50 nm. Further, to evaluate the performance of the disclosed fiber optic ring laser, the total output power and SMSR of each generated wavelength are measured and analyzed in an operating range from 1578 to 1632 nm.

In various aspects of the disclosure, non-limiting definitions of one or more terms that will be used in the document are provided below.

A "Gain Medium" is a material that has quantum properties to amplify laser beams by means of stimulated emission. The gain medium is the source of optical gain within a laser which results from the emission of molecular or electronic transitions from a higher energy state to a lower energy state.

An "Amplified Spontaneous Emission" (ASE) is a light that is produced by spontaneous emission or that has been optically amplified by the process of stimulated emission in a gain medium.

Figure 1:
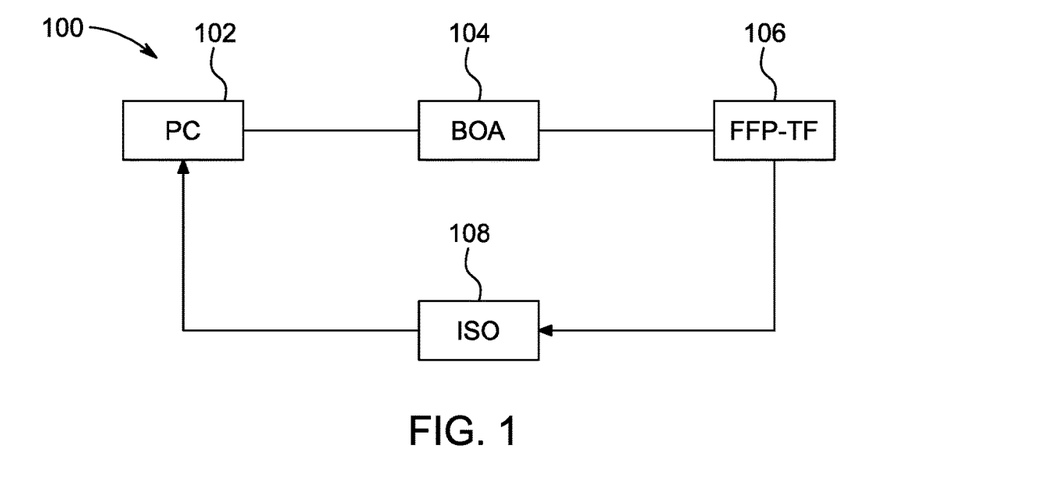
FIG. 1 is an exemplary schematic diagram of a fiber optic ring laser, according to certain embodiments.

FIG. 1 is an exemplary schematic diagram of the fiber optic ring laser 100 which is configured to operate in L band/extended L band spectrum. As shown in FIG. 1, the fiber optic ring laser 100 (hereinafter referred to as "laser 100") includes various components such as a polarization controller (PC) 102, a semiconductor booster optical amplifier (BOA) 104, a Fiber Fabry Perot Tunable Filter (FFP-TF) 106, and an optical isolator (ISO) 108. In an aspect of the present disclosure, the semiconductor BOA 104, the FFP-TF 106, the ISO 108 and the PC 102 are communicatively coupled to form a ring configuration that is configured to implement a continuously tunable BOA-based fiber ring laser 100.

The semiconductor BOA 104 is configured to function as a gain medium. The semiconductor BOA 104 is placed at an optical transmitter side to enhance the power level of the optical signals to be transmitted, and generate amplified optical signals as output. The semiconductor BOA 104 is configured to amplify the signals such that the amplified (optical) signals are capable of covering a large distance. Further, there may be various kinds of losses that occur in optical elements (for example, optical coupler, splitters, WDM multiplexers, and external optical modulators) between the laser and optical fibers. The semiconductor BOA 104 is configured to amplify the optical signals such that the amplified optical signal is able to compensate such losses. The semiconductor BOA 104 uses a semiconductor to provide the gain medium. The semiconductor BOA 104 is similar to Fabry-Perot laser diodes in structure, however having anti-reflection design elements at the end faces. In an aspect, the disclosed laser 100 employs a 14 pin butterfly packaged L-band BOA 104. The semiconductor BOA 104 is a single pass traveling-wave type amplifier, equally capable of amplifying both single and multi-wavelength signals. The semiconductor BOA 104 includes a InP/InGaAsP Multiple Quantum Well (MQW) structure with a typical refractive index of 3.2. In implementations, the semiconductor BOA 104 is configured to exhibit low coupling losses.

In an aspect, the semiconductor BOA 104 is a semiconductor chip on sub-mount (C) or a semiconductor chip on heatsink (H). The end faces of the semiconductor chip are anti-reflection (AR)-coated with a reflection typically less than 0.1%. The input and output fiber of the semiconductor BOA 104 are coupled to a ridge waveguide on an optical amplifier chip. When current is applied across the ridge waveguide, excited state electrons are stimulated by input optical signal, resulting in photon replication and signal gain.

In an operative aspect, the coupling losses, such as fiber-to-chip and chip-to-fiber coupling losses, may in a range from 1.5 to 2.5 dB. Such coupling losses affect the total gain, saturation power ($P_{sat}$), and noise figure (NF) of the amplifier. Although the gain exhibited by the amplifier surpasses the losses, nevertheless these losses may play an important role in defining the performance of the amplifier. For instance, the noise figure increases by 1 dB for a 1 dB drop in input coupling efficiency. Similarly, the saturation power drops by 1 dB for a drop of 1 dB in output coupling efficiency. The amplifier typically exhibits a gain ripple within 0.05 dB. In an aspect of the present disclosure, the BOA 104 is operable to provide a 3 dB gain bandwidth for a range of 80-90 nm.

In a working aspect, a laser diode drive (not shown) is electrically coupled with the BOA 104, which is configured to drive the BOA 104 by providing a drive current. A change in drive current causes a change in the laser's wavelength and the output power. The drive current from the laser diode driver initiates the recombination of electron-hole pairs in the gain medium of the semiconductor BOA 104. This recombination results in the generation of spontaneous emissions of photons from the semiconductor BOA 104 and thereby providing the gain.

In an aspect, the FFP-TF 106 is configured to function as a wavelength selection element. In an operative aspect, the FFP-TF 106 is commutatively coupled with the semiconductor BOA 104 and receives the amplified optical signal from the semiconductor BOA 104. The FFP-TF 106 is configured to filter the received amplified optical signal of the semiconductor BOA 104 and to select a wavelength in L band/extended L band spectrum. In an aspect, the FFP-TF 106 is employed in a cavity. The continuously tunable booster amplifier-based fiber ring laser 100 is operable to be continuously tuned over a wavelength range selected from L-band and the L-extended band, by varying a voltage applied to the FFP-TF 106, and the wavelength range varies from approximately 1578 to 1632 nm. The disclosed construction of the FFP-TF 106 removes all the well-known issues, including misalignment, environmental sensitivity, and extraneous modes. The laser 100 is now tuned over L band and extended L band by changing the driving voltage applied to the FFP-TF 106, which is operable from −20° to +80° C. The voltage per free spectral range (FSR) of the FFP-TF 106 may be tuned from 0 to 12 V. The FFP-TF 106 offers an optical 3 dB bandwidth of 110 μm (13.8 GHz) with FSR of 220 nm, which makes the finesse of the FFP-TF 106 to be 2000. The insertion loss offered by the FFP-TF 106 is less than 3 dB over the operating range of the FFP-TF 106.

In an aspect, the FFP-TF 106 is a broad-band filter that is electronically tunable to work as a wavelength selection element in the cavity. In another aspect, the FFP-TF 106 is a narrow-band filter and provides sufficient side-mode suppression to stabilize the laser 100.

It is desirable that an output beam of the laser 100 is optically isolated to prevent back reflections damaging the laser 100 or causing undesirable optical interactions. The optical isolation is typically performed using an optical isolator through which the output beam of the laser 100 is coupled. Therefore, preventing back reflected light from returning to the laser 100 by the optical isolator (ISO) 108. The ISO 108 is configured to ensure unidirectional operation of the laser 100. The ISO 108 prevents unwanted feedback into an optical oscillator, such as a laser cavity. In an aspect, the ISO 108 is configured to improve the isolation between an optical source and a transmission link in an optical communications system.

In an aspect, the polarization controller (PC) 102 is an optical device that is configured to modify the polarization state of light. The PC 102 is employed for attaining an optimized polarization state in order to achieve a stable-generated output in terms of output power and wavelength. In an aspect, the PC 102 is inserted in the cavity (not shown). In another aspect, the PC 102 is configured to adjust the state of polarization to achieve a relatively high signal-to-noise ratio (SNR) and to achieve a relatively stable output power.

In an aspect, the continuously tunable optic fiber ring laser 100 is operable to provide an output power of approximately 5.2 dBm and a side mode suppression ratio (SMSR) of approximately 55 dB.

Figure 2:
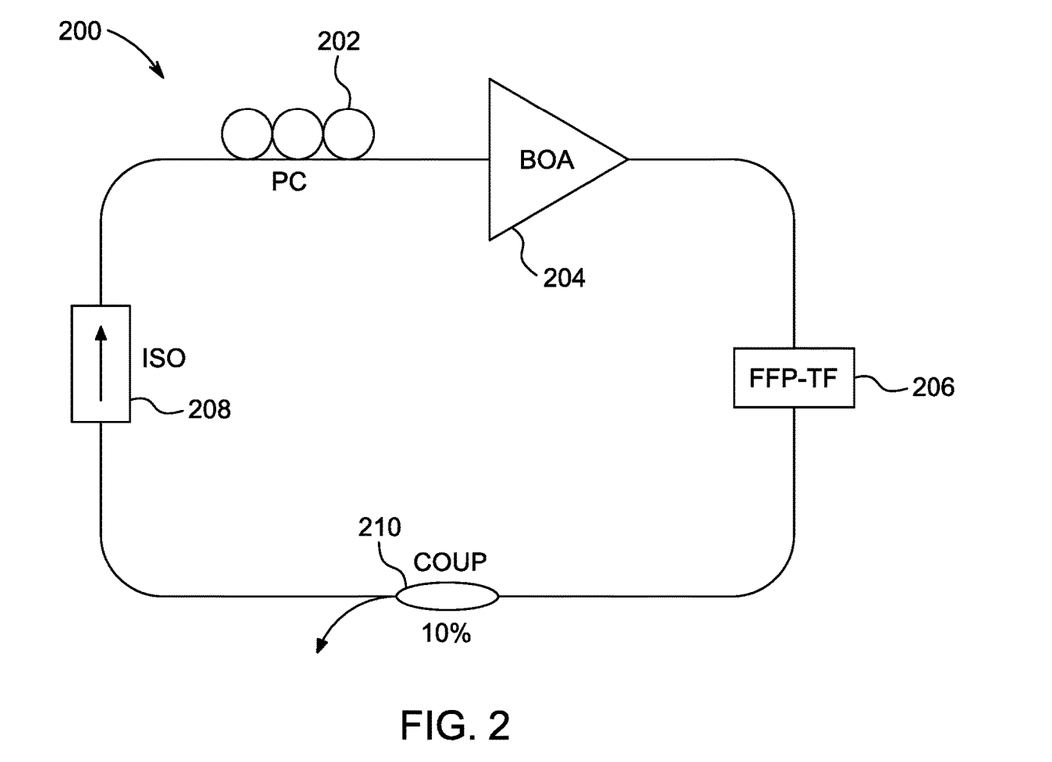
FIG. 2 is a block diagram of the fiber optic ring laser, according to certain embodiments.

FIG. 2 illustrates a block diagram of a fiber optic ring laser 200, according to another embodiment of the present disclosure. As shown in FIG. 2, the fiber optic ring laser 200 (hereinafter referred to as laser 200) includes various components such as a polarization controller (PC) 202, a semiconductor BOA 204, a Fiber Fabry Perot Tunable Filter (FFP-TF) 206, an optical isolator (ISO) 208, and a fiber coupler 210.

The construction of laser 200 is similar to that of the laser 100, and thus the construction is not repeated here in detail for the sake of brevity. The semiconductor BOA 204 is configured to function as a gain medium and amplify the optical signal. Further, the FFP-TF 206 is configured to function as a wavelength selection element and select a wavelength in L band/extended L band spectrum. The ISO 208 is configured to ensure unidirectional operation of the fiber optic ring laser 200 such that the ISO 208 prevents back reflected light from returning to the laser 200. In an aspect, the PC 202 is configured to attain an optimized polarization state in order to achieve a stable-generated output in terms of output power.

As shown by the FIG. 2, in a connecting aspect, the output of the semiconductor BOA 204 is coupled to an input of the FFP-TF 206. Further, the output of the FFP-TF 206 is coupled to the fiber coupler 210. The fiber coupler 210 is further coupled to the ISO 208. The fiber coupler 210 is configured to tap the output from the laser 200. A 10% fiber coupler 210 is configured to tap the output from the laser 200, the 10% light is directed to an optical spectrum analyzer (OSA), such as illustrated in FIG. 2, for example.

The ISO 208 is coupled to the PC 202, which in turn is coupled to the semiconductor BOA 204 to implement the continuously tunable booster amplifier-based fiber ring laser 200.

The fiber coupler 210 provides the output from the continuously tunable booster amplifier-based fiber ring laser 200, wherein 90% of amplified spontaneous emission (ASE) is fed back to the cavity. The fiber coupler 210 is located in the cavity. The fiber coupler 210 is configured to receive an optical signal from the FFP-TF 206. The fiber coupler 210 is configured to generate a split output, for example, a portion of the received input signal is fed back to the cavity. As shown in FIG. 2, the 10% fiber coupler 210 is illustrated that is configured to provide an output from the laser 200. In 10% fiber coupler 210, the 10% signal is given as output, whereas 90% of the ASE is fed back to the cavity 200. In an aspect, an optical spectrum analyzer (OSA), and an optical power meter are used to characterize the proposed semiconductor fiber ring laser 100, 200. For example, a portion (10%) of the split output from the fiber coupler 210, provides a tunable wavelength coherent beam emitted from the laser 100, and another portion (90%) of the split output includes optical signals retained in the cavity.

Figure 3:
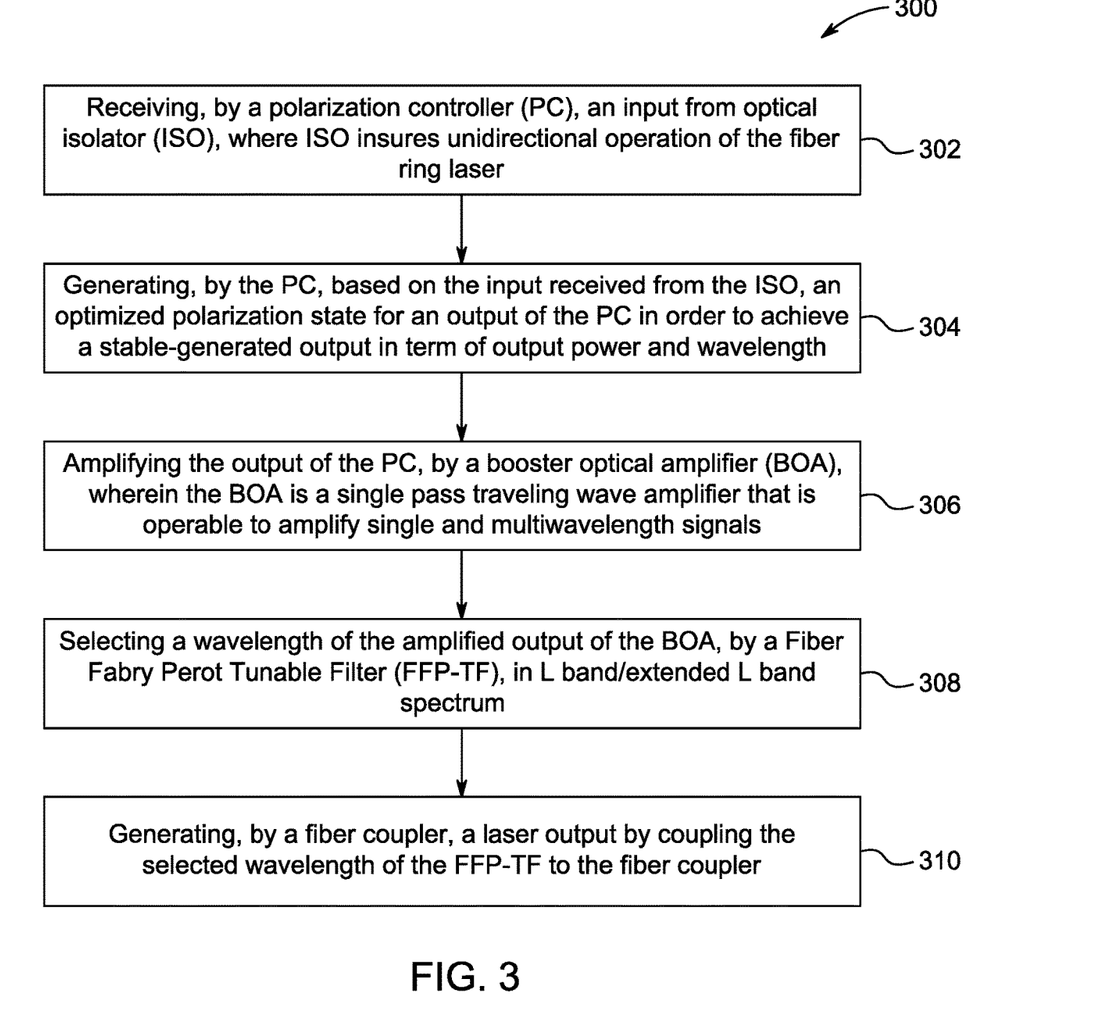
FIG. 3 is an exemplary flowchart for continuously tuning a booster optical amplifier (BOA)-based fiber ring laser, according to certain embodiments.

FIG. 3 is an exemplary flowchart 300 for continuously tuning a BOA-based fiber ring laser 100, according to certain embodiments.

Step 302 includes receiving an input from the ISO 108 by the PC 102. In an aspect, the ISO 108 ensures unidirectional operation of the laser 100.

Step 304 includes generating an optimized polarization state by the PC 102 based on the input received from the ISO 108. In an aspect of the present disclosure, the PC 102 is configured to attain an optimized polarization state in order to achieve a stable-generated output in terms of output power and wavelength.

Step 306 includes amplifying the output of the PC 102 by the BOA 104. In an aspect, the BOA 104 acts as a gain medium. In another aspect, the BOA 104 is a single pass traveling wave amplifier that is operable to amplify single and multi-wavelength signals. In an aspect, the BOA 104 comprises a InP/InGaAsP Multiple Quantum Well (MQW) structure with a typical refractive index of 3.2

Step 308 includes selecting a wavelength of the amplified output of the BOA 104 by an FFP-TF 106. In an aspect, the FFP-TF 106 acts as a wavelength selection element and selects a wavelength that lies in L band/extended L band spectrum.

Step 310 includes generating a laser output by a fiber coupler 210. In an embodiment, the laser output is generated by coupling the selected wavelength of the FFP-TF 206 to the fiber coupler 210. In an aspect, the fiber coupler 210 is configured to provide the output from the continuously tunable booster amplifier-based fiber ring laser 200, wherein 90% of amplified spontaneous emission (ASE) is fed back to the cavity.

The following examples are provided to illustrate further and to facilitate the understanding of the present disclosure.

Experimental Data and Analysis

The present disclosure demonstrates a simple design of semiconductor fiber ring laser covering a broad tunable range, comprising L and extended L bands. The disclosed laser 100 can be continuously tuned over 54 nm from 1578 to 1632 nm with a total output power of around 5.2 dBm and having a side mode suppression ratio (SMSR) of around 55 dB by incorporating a Fabry Perot tunable filter. The generated output is highly stable with power and wavelength fluctuations within 0.2 dB and 0.05 nm, respectively.

To evaluate the performance of the disclosed laser 100, the total output power, and SMSR of each generated wavelength were measured and analyzed in the operating range from 1578 to 1632 nm. In addition, the stability tests were performed in terms of output power and wavelength fluctuations.

Figure 4:
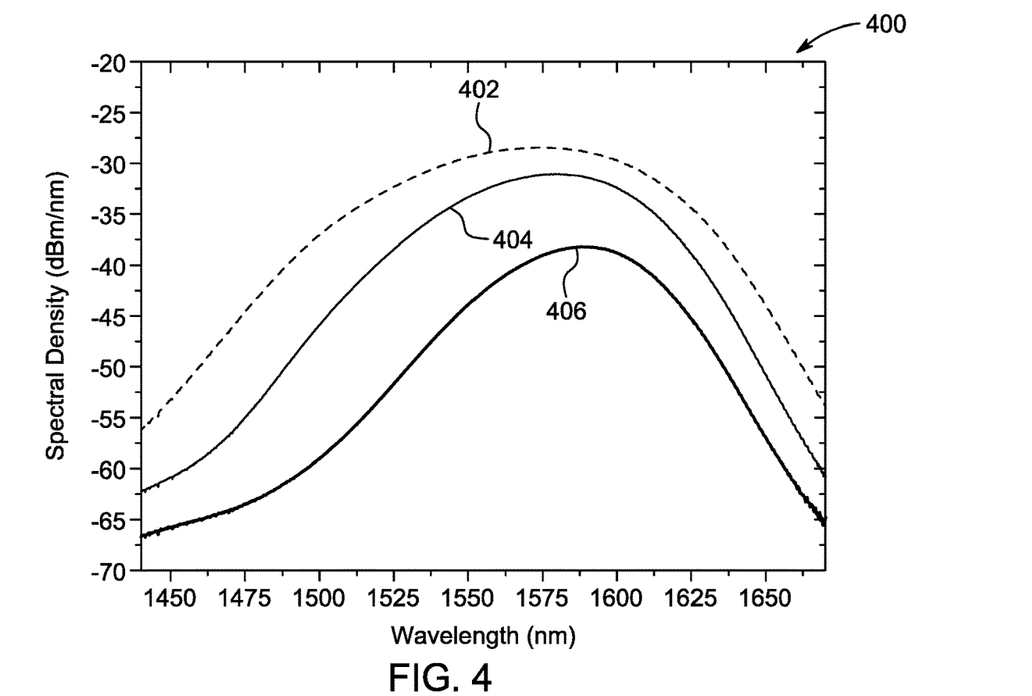
FIG. 4 is an exemplary graph showing superimposed amplified spontaneous emission (ASE) spectra for different biasing currents, according to certain embodiments.

FIG. 4 is an exemplary graph (400) showing superimposed amplified spontaneous emission (ASE) spectra for different biasing currents, according to certain embodiments. FIG. 4 shows the superimposed ASE spectra exhibited by the BOA 104 for different values of bias currents. At the lowest bias current of 100 mA, which is also the threshold current of the BOA 104, a peak ASE power obtained is 38 dBm (as shown by 406). When the bias current is further increased to 300 mA, a peak ASE (as shown by 404) power of 33 dBm is obtained, an increase of 5 dB. However, as the bias current is further increased to 400 mA (as shown by 402), a further increase of 5 dB is observed in the ASE peak power, which rises to 28 dBm. The BOA 104 is now operating in the gain saturation regime and does not show much improvement in ASE peak power with a further increase in the bias current. A maximum 3-dB optical bandwidth of 90 nm is observed with the peak ASE wavelength of around 1575 nm at a bias current of 400 mA. This broad bandwidth enables the realization of large tunability of the laser over L and extended L bands.

Figure 5:
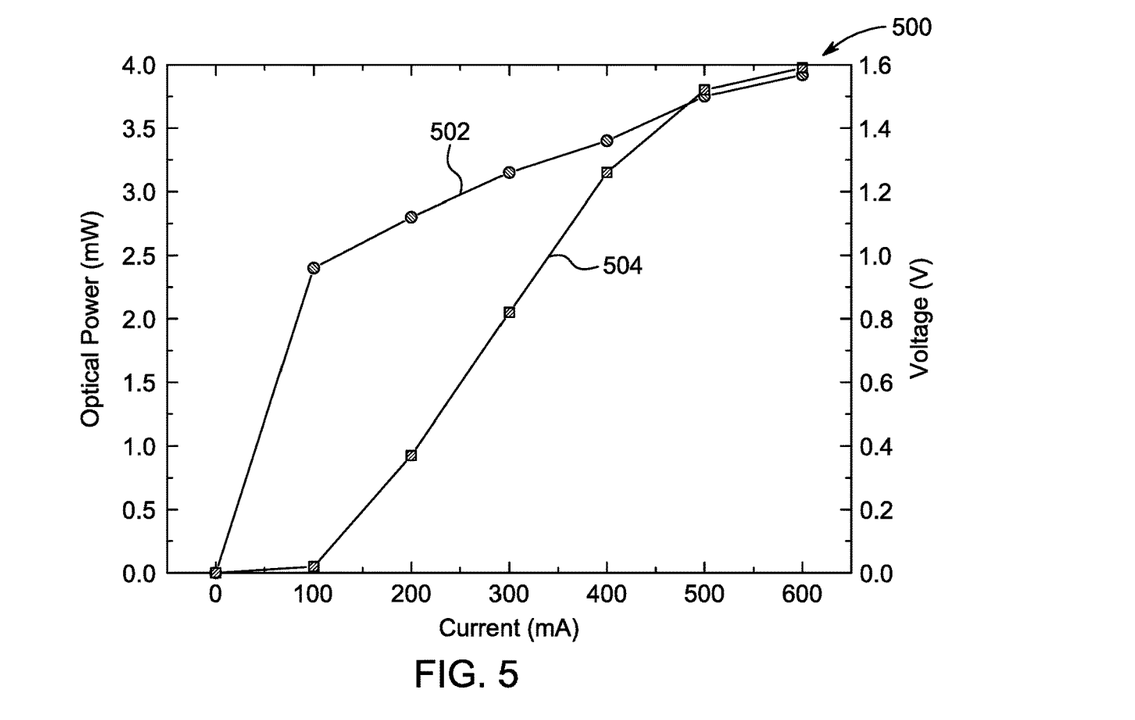
FIG. 5 is an exemplary graph illustrating an optical output-current-voltage (LIV) characteristics of the BOA, according to certain embodiments.

FIG. 5 is an exemplary graph (500) illustrating optical output-current-voltage characteristics (LIV characteristics) of the BOA 104, according to certain embodiments. As shown in FIG. 5, the BOA 104 exhibits a threshold current ($I_{th}$) of 100 mA for a forward voltage of 1 V (as shown by 504). The output optical power reaches up to 4 mW for a forward voltage of 1.6 V at a biasing current of 600 mA (as shown by 502).

Figure 6:
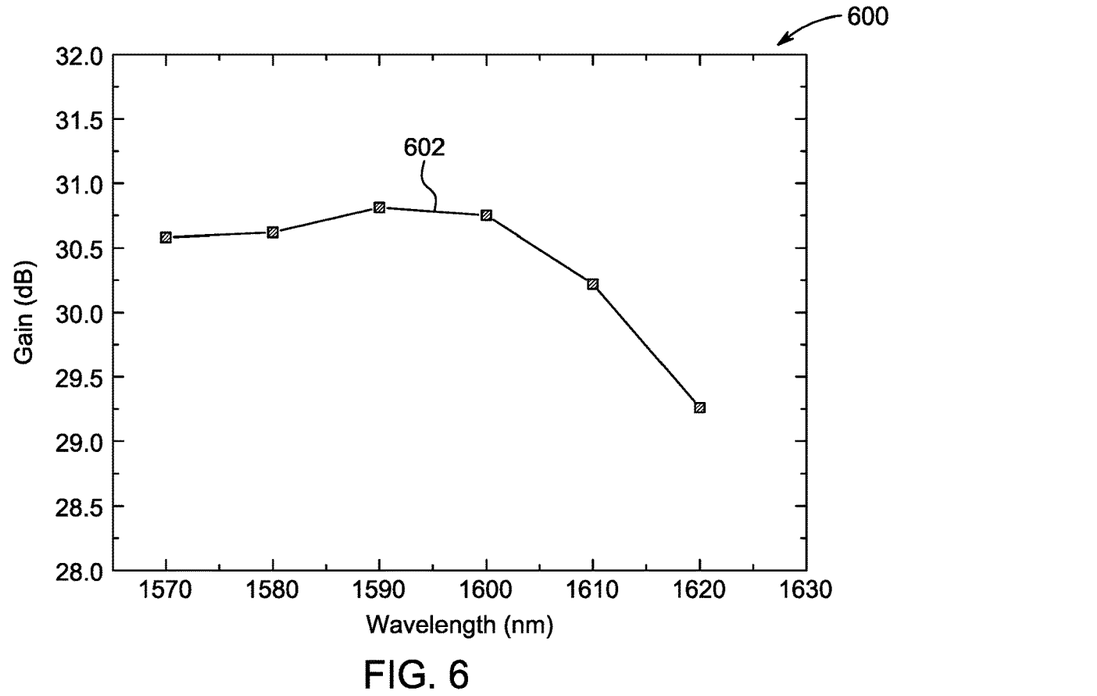
FIG. 6 is an exemplary graph illustrating small signal gain Vs. wavelength profile of the BOA, according to certain embodiments.

FIG. 6 is an exemplary graph (600) illustrating small signal gain Vs. wavelength profile of the BOA 104, according to certain embodiments. FIG. 6 indicates that the small signal gain profile of the BOA 104 against wavelength for an input signal power of 20 dBm, while operating at a drive current of 400 mA. The BOA 104 exhibits a maximum gain of 30.8 dB at a wavelength of 1590 nm (as shown by 602).

Figure 7:
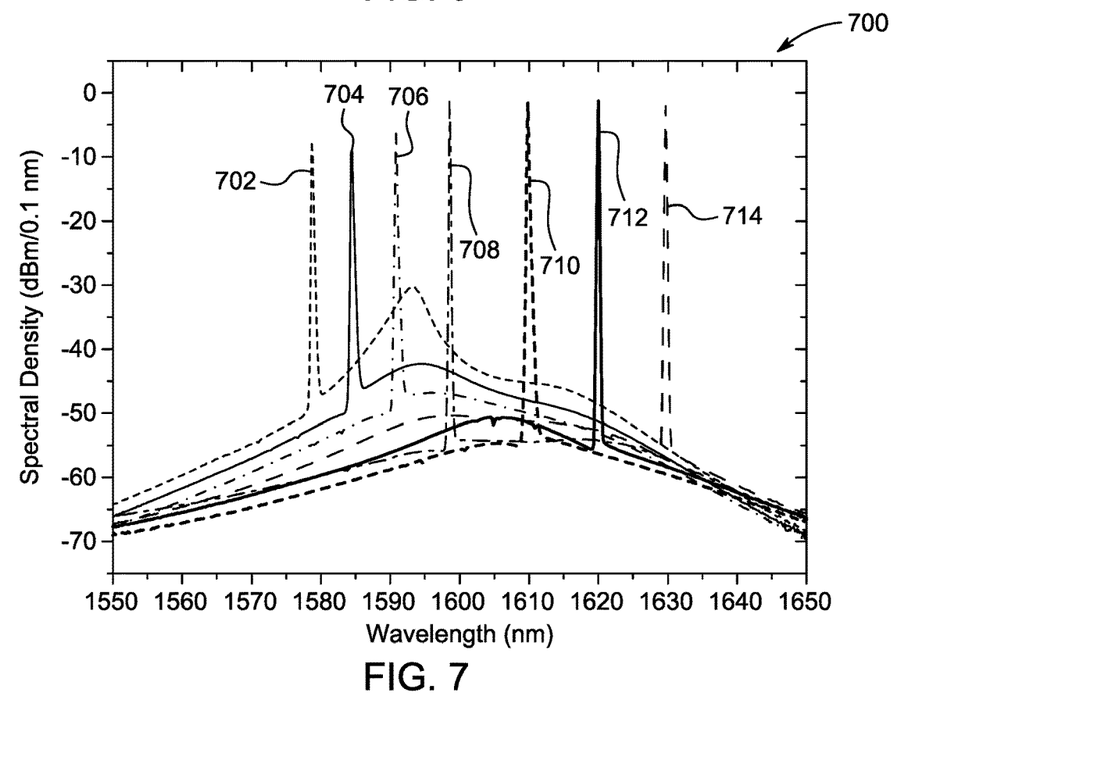
FIG. 7 is an exemplary graph illustrating superimposed spectra of a tunable laser (fiber optic ring laser) in L and extended L bands, according to certain embodiments.

FIG. 7 is an exemplary graph (700) illustrating superimposed spectra of a tunable laser (fiber optic ring laser) 100 in L and extended L bands, according to certain embodiments. FIG. 7 shows optical spectra of a broad-band tunable laser operating when the voltage applied to the FFP-TF 106 is varied. The laser 100 is configured to tune from 1578 to 1632 nm, covering a range of around 54 nm in L and extended L bands, by varying the voltage applied to the FFP-TF 106. Signal 702 shows the output wavelength corresponding to the wavelength 1578 nm. Further, signal 704 represents the output wavelength corresponding to the wavelength 1585 nm. Also, signals 706 and 708 show the output wavelength corresponding to the wavelength 1591 nm and 1598 nm, respectively. Further, signals 710 and 712 show the output wavelength corresponding to the wavelength 1610 nm and 1617 nm, respectively. As evident from FIG. 7, when the passband of FFP-TF 106 is further tuned above 1632 nm (as shown by signal 714), the output wavelength is not generated due to insufficient gain provided by the BOA 104 and also due to the high loss of the tunable FFP-TF 106 at higher wavelengths. The output peak power is almost constant at around −1 dBm in the range from 1598 to 1632 nm.

Figure 8:
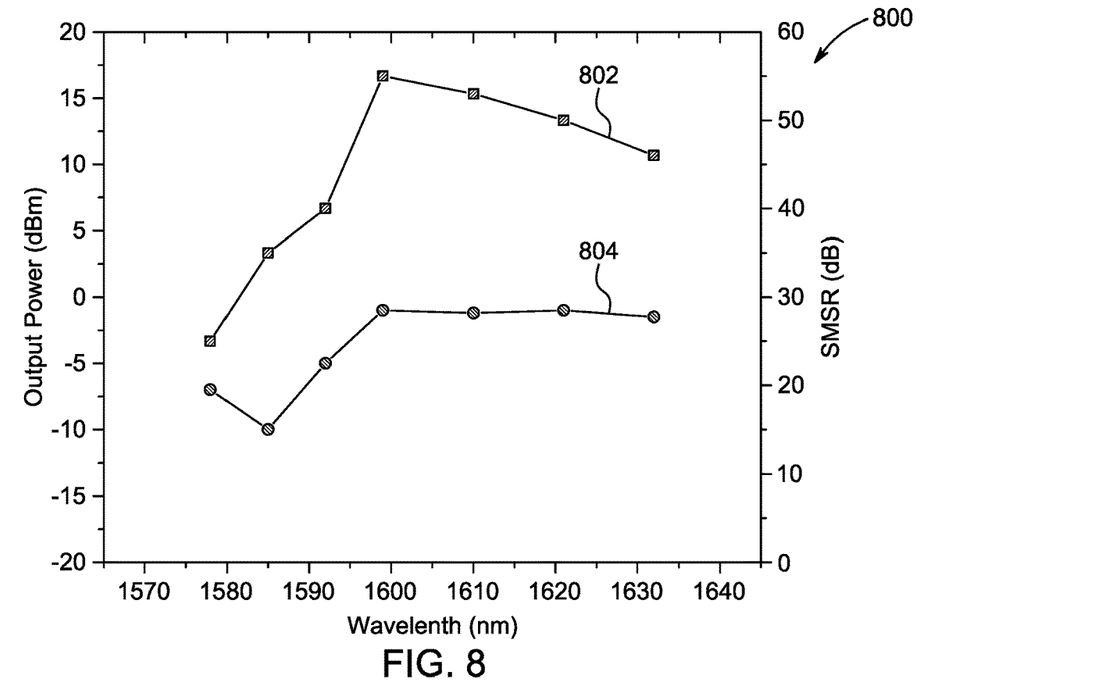
FIG. 8 is an exemplary graph illustrating a measured output peak power and SMSR of the fiber optic ring laser, according to certain embodiments.

FIG. 8 is an exemplary graph (800) illustrating a measured output peak power and SMSR of the fiber optic ring laser, according to certain embodiments. As shown in FIG. 8, the minimum peak output power of 10 dBm is observed at 1585 nm, while a maximum peak power of 1 dBm is observed at around 1599.6 nm (as shown by 804). The minimum SMSR of 25 dB is observed at 1578 nm, while the maximum SMSR of 55 dB is observed at 1599.6 nm (as shown by 802). In order to evaluate the stability of the proposed laser scheme, a short-term surveillance of total output power and wavelength is performed. A lasing wavelength of 1599.6 nm with a total output power of 5.2 dBm is selected for the measurements.

Figure 9:
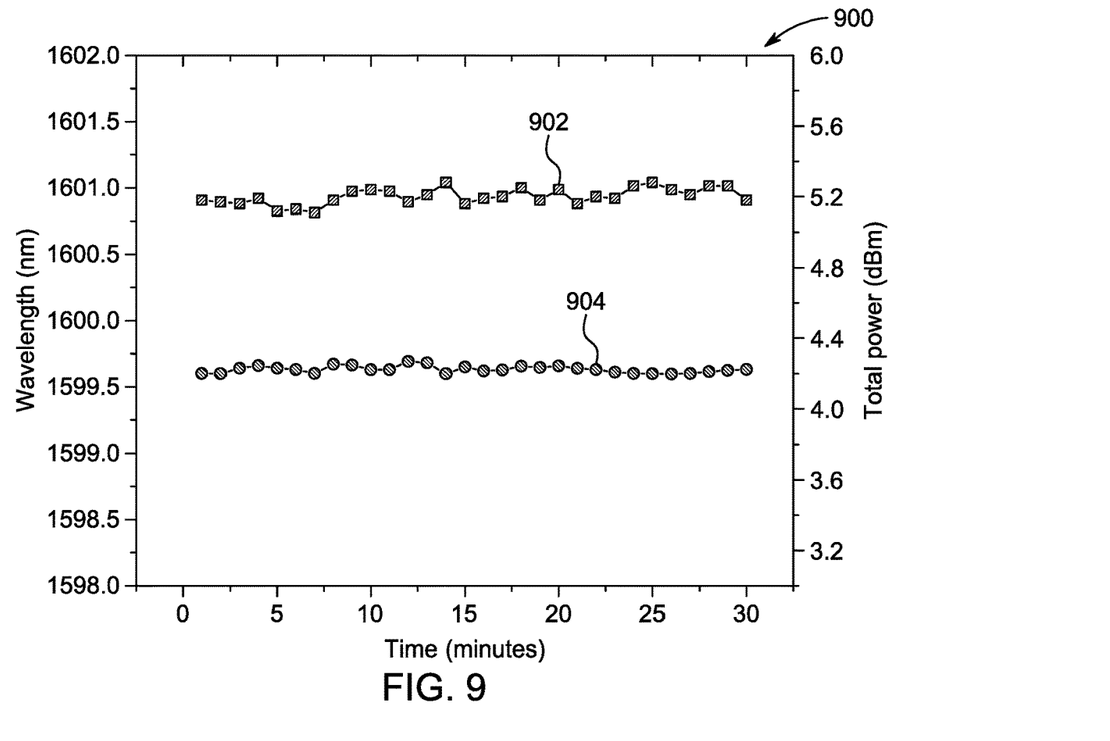
FIG. 9 is an exemplary graph illustrating a measured stability performance of the fiber optic ring laser in terms of wavelength and total output power, according to certain embodiments.

FIG. 9 is an exemplary graph (900) illustrating a measured stability performance of the fiber optic ring laser 100 in terms of wavelength and total output power, according to certain embodiments. As illustrated in FIG. 9, the observation time for measuring stability performance is 30 minutes. The total output power and wavelength fluctuations are, respectively, within 0.2 dB (signal 902), and 0.05 nm (signal 904). As a result, the disclosed laser 100 is highly stable based on the measurement results. In an aspect, the stabilities of the laser 100 in terms of power and wavelength may be further improved by properly packaging the proposed laser.

As experimentally demonstrated an L band, the BOA 104 is configured to serve as a gain medium and a tunable filter 106 for wavelength tunability. The laser 100 may be configured to be continuously tuned over 54 nm with a total output power of 5.2 dBm. In an aspect, the maximum peak power and SMSR of around −1 dBm and 55 dB, respectively. In another aspect, the fluctuations in terms of total output power and wavelength were within 0.2 dB and 0.05 nm, respectively. The disclosed laser 100 offers numerous advantages in terms of simple configuration, compact size, and high stability at room temperature.

An embodiment is illustrated with respect to FIGS. 1-3. The embodiment describes a non-transitory computer readable storage medium having computer program code stored thereon, the computer program code, when executed by one or more processors implemented on a continuously tuning booster optical amplifier (BOA)-based fiber ring laser 100, causes the continuously tuning the booster optical amplifier (BOA)-based fiber ring laser (fiber ring laser) 100 to perform a method. The method includes receiving, by a polarization controller (PC) 102, an input from optical isolator (ISO) 108, wherein the ISO 108 ensures unidirectional operation of the fiber ring laser 100; generating, by the PC 102, based on the input received from the ISO 108, an optimized polarization state for an output of the PC 102 in order to achieve a stable-generated output in terms of output power and wavelength; amplifying the output of the PC 102, by the BOA 104, wherein the BOA 104 is a single pass traveling wave amplifier that is operable to amplify single and multi-wavelength signals; selecting a wavelength of the amplified output of the BOA 104, by a Fiber Fabry Perot Tunable Filter (FFP-TF) 106, in L band/extended L band spectrum; and generating, by a fiber coupler 210, a laser output by coupling the selected wavelength of the FFP-TF 106 to the fiber coupler 210.

The BOA 104 is a single pass traveling-wave type amplifier, capable of amplifying single and multi-wavelength signals, wherein the BOA 104 comprises a InP/InGaAsP Multiple Quantum Well (MQW) structure, and wherein the BOA is operable to provide a 3 dB gain bandwidth for a range of 80-90 nm.

The BOA 104, the FFP-TF 106, the ISO 108, the PC 102 are positioned in the cavity.

Figure 10:
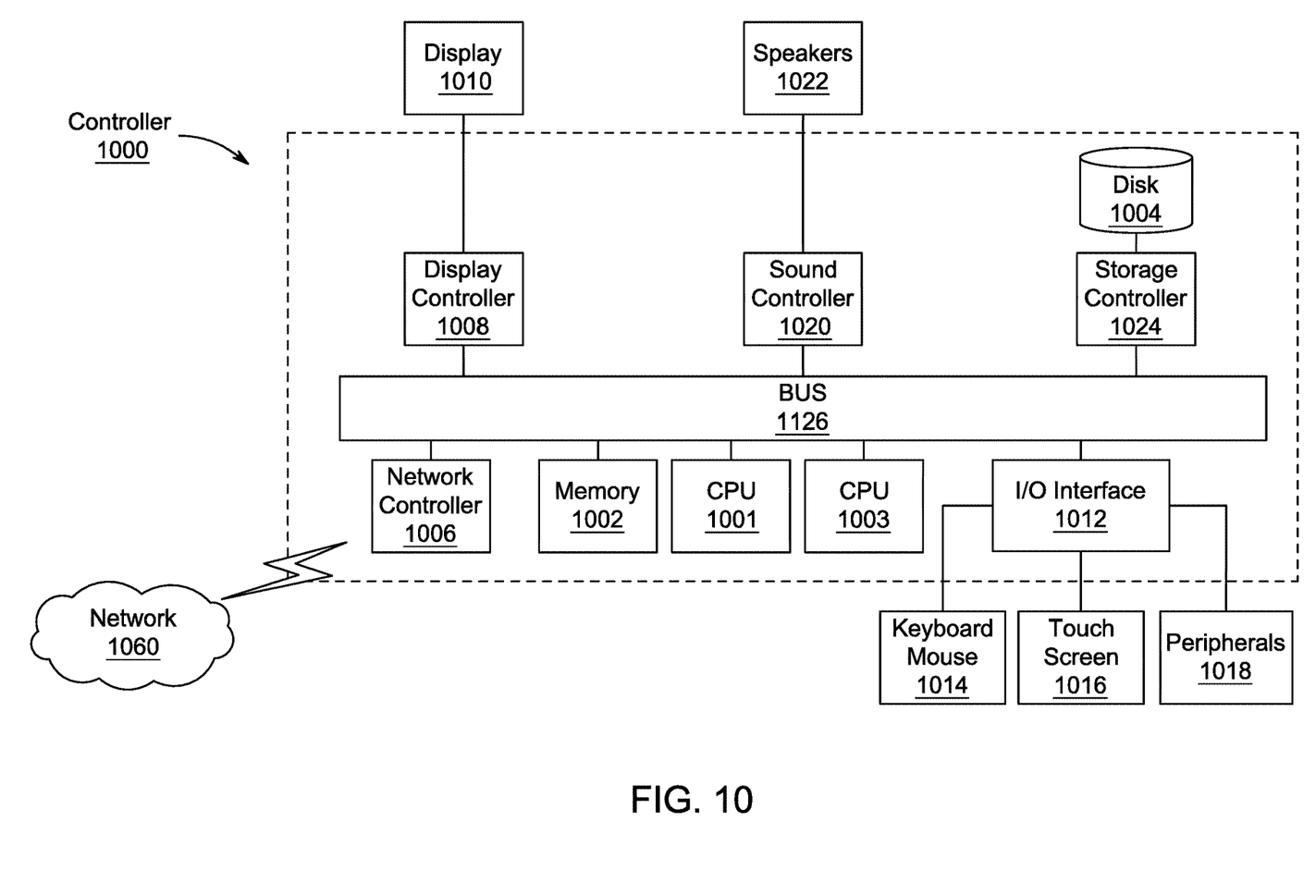
FIG. 10 is an illustration of a non-limiting example of details of computing hardware used in the computing system, according to aspects of the present disclosure.

Next, further details of the hardware description of the computing environment of FIG. 1 according to exemplary embodiments is described with reference to FIG. 10. In FIG. 10, a controller 1000 is described as representative of the polarization controller of FIG. 1 in which the controller is a computing device which includes a CPU 1001 which performs the processes described above/below. The process data and instructions may be stored in memory 1002. These processes and instructions may also be stored on a storage medium disk 1004 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 1001, 1003 and an operating system such as Microsoft Windows 9, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 1001 or CPU 1003 may be a Xenon or Core processor from Intel of America or an Opteron processor from AMD of America, or may be other processor types that would be recognized by one of ordinary skilled in the art. Alternatively, the CPU 1001, 1003 may be implemented on an FPGA, ASIC, PLD or using discrete logic circuits, as one of ordinary skilled in the art would recognize. Further, CPU 1001, 1003 may be implemented as multiple processors cooperatively working in parallel to perform the instructions of the inventive processes described above.

The computing device in FIG. 10 also includes a network controller 1006, such as an Intel Ethernet PRO network interface card from Intel Corporation of America, for interfacing with network 1060. As can be appreciated, the network 1060 can be a public network, such as the Internet, or a private network such as an LAN or WAN network, or any combination thereof and can also include PSTN or ISDN sub-networks. The network 1060 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The computing device further includes a display controller 1008, such as a NVIDIA GeForce GTX or Quadro graphics adaptor from NVIDIA Corporation of America for interfacing with display 1010, such as a Hewlett Packard HPL2445w LCD monitor. A general purpose I/O interface 1012 interfaces with a keyboard and/or mouse 1014 as well as a touch screen panel 1016 on or separate from display 1010. General purpose I/O interface also connects to a variety of peripherals 1018 including printers and scanners, such as an OfficeJet or DeskJet from Hewlett Packard.

A sound controller 1020 is also provided in the computing device such as Sound Blaster X-Fi Titanium from Creative, to interface with speakers/microphone 1022 thereby providing sounds and/or music.

The general purpose storage controller 1024 connects the storage medium disk 1004 with communication bus 1026, which may be an ISA, EISA, VESA, PCI, or similar, for interconnecting all of the components of the computing device. A description of the general features and functionality of the display 1010, keyboard and/or mouse 1014, as well as the display controller 1008, storage controller 1024, network controller 1006, sound controller 1020, and general purpose I/O interface 1012 is omitted herein for brevity as these features are known.

The exemplary circuit elements described in the context of the present disclosure may be replaced with other elements and structured differently than the examples provided herein.

Figure 11:
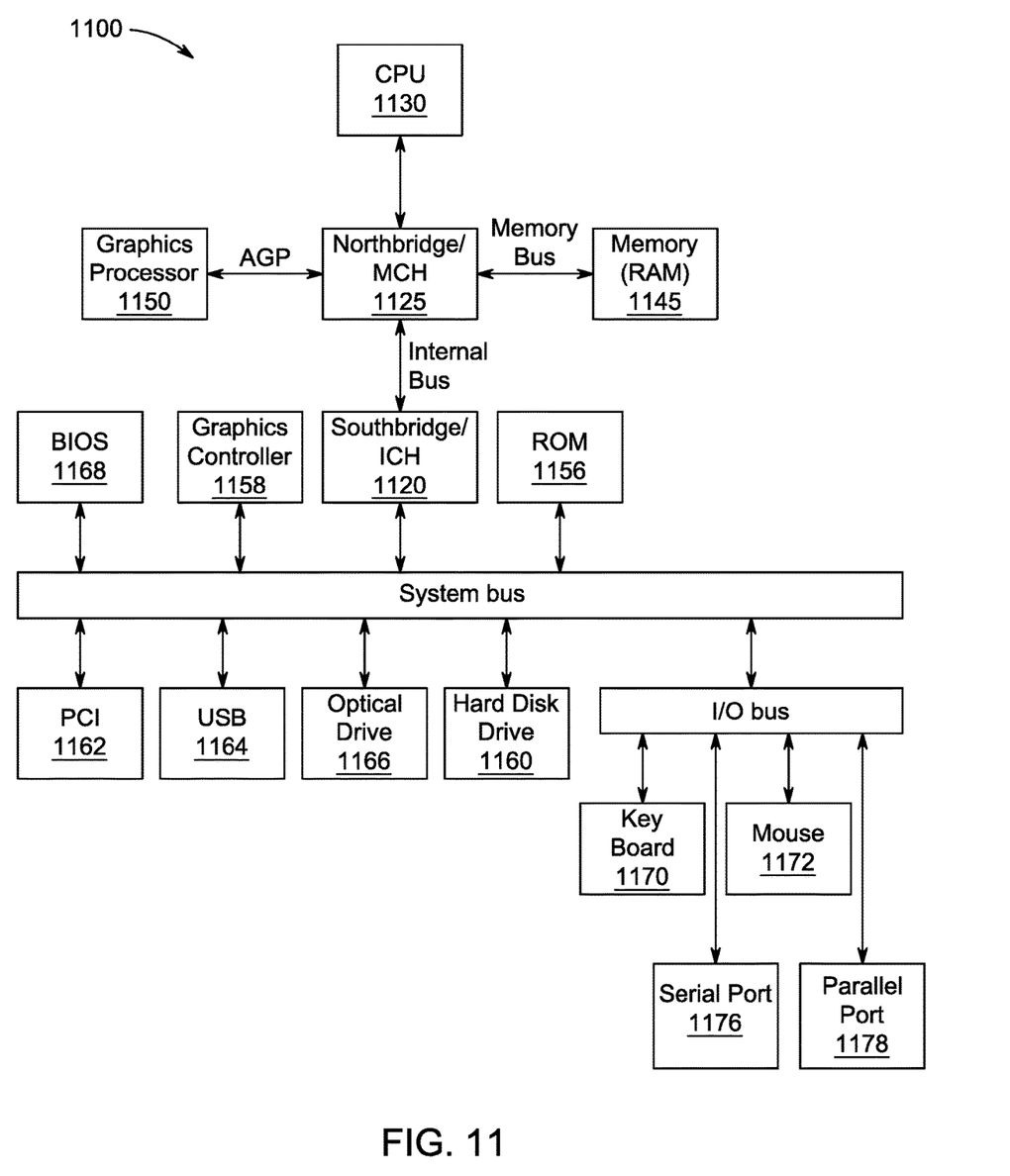
FIG. 11 is an exemplary schematic diagram of a data processing system used within the computing system, according to aspects of the present disclosure.

Moreover, circuitry configured to perform features described herein may be implemented in multiple circuit units (e.g., chips), or the features may be combined in circuitry on a single chipset, as shown on FIG. 11.

FIG. 11 shows a schematic diagram of a data processing system 1100 used within the computing system, according to exemplary aspects of the present disclosure. The data processing system 1100 is an example of a computer in which code or instructions implementing the processes of the illustrative aspects of the present disclosure may be located.

In FIG. 11, data processing system 1100 employs a hub architecture including a north bridge and memory controller hub (NB/MCH) 1125 and a south bridge and input/output (I/O) controller hub (SB/ICH) 1120. The central processing unit (CPU) 1130 is connected to NB/MCH 1125. The NB/MCH 1125 also connects to the memory 1145 via a memory bus, and connects to the graphics processor 1150 via an accelerated graphics port (AGP). The NB/MCH 1125 also connects to the SB/ICH 1120 via an internal bus (e.g., a unified media interface or a direct media interface). The CPU Processing unit 1130 may contain one or more processors and even may be implemented using one or more heterogeneous processor systems.

Figure 12:
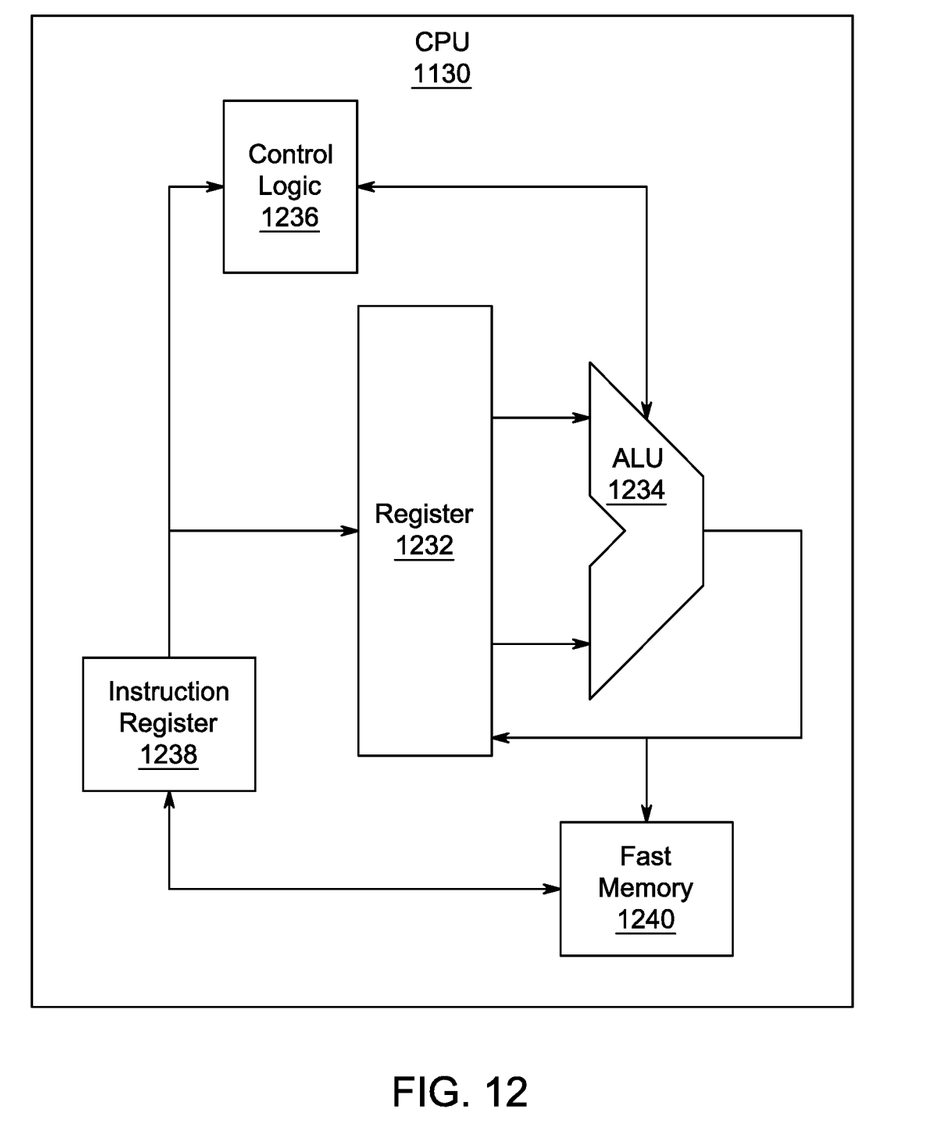
FIG. 12 is an exemplary schematic diagram of a processor used with the computing system, according to aspects of the present disclosure.

For example, FIG. 12 shows one aspects of the present disclosure of CPU 1130. In one aspects of the present disclosure, the instruction register 1238 retrieves instructions from the fast memory 1240. At least part of these instructions is fetched from the instruction register 1238 by the control logic 1236 and interpreted according to the instruction set architecture of the CPU 1130. Part of the instructions can also be directed to the register 1232. In one aspects of the present disclosure the instructions are decoded according to a hardwired method, and in other aspects of the present disclosure the instructions are decoded according to a microprogram that translates instructions into sets of CPU configuration signals that are applied sequentially over multiple clock pulses. After fetching and decoding the instructions, the instructions are executed using the arithmetic logic unit (ALU) 1234 that loads values from the register 1232 and performs logical and mathematical operations on the loaded values according to the instructions. The results from these operations can be feedback into the register and/or stored in the fast memory 1240. According to certain aspects of the present disclosures, the instruction set architecture of the CPU 1130 can use a reduced instruction set architecture, a complex instruction set architecture, a vector processor architecture, a very large instruction word architecture. Furthermore, the CPU 1130 can be based on the Von Neuman model or the Harvard model. The CPU 1130 can be a digital signal processor, an FPGA, an ASIC, a PLA, a PLD, or a CPLD. Further, the CPU 1130 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 11, the data processing system 1100 can include that the SB/ICH 1120 is coupled through a system bus to an I/O Bus, a read only memory (ROM) 1156, universal serial bus (USB) port 1164, a flash binary input/output system (BIOS) 1168, and a graphics controller 1158. PCI/PCIe devices can also be coupled to SB/ICH 1120 through a PCI bus 1162.

The PCI devices may include, for example, Ethernet adapters, add-in cards, and PC cards for notebook computers. The Hard disk drive 1160 and CD-ROM 1156 can use, for example, an integrated drive electronics (IDE) or serial advanced technology attachment (SATA) interface. In one aspects of the present disclosure, the I/O bus can include a super I/O (SIO) device.

Further, the hard disk drive (HDD) 1160 and optical drive 1166 can also be coupled to the SB/ICH 1120 through a system bus. In one aspect of the present disclosure, a keyboard 1170, a mouse 1172, a parallel port 1178, and a serial port 1176 can be connected to the system bus through the I/O bus. Other peripherals and devices that can be connected to the SB/ICH 1220 using a mass storage controller such as SATA or PATA, an Ethernet port, an ISA bus, an LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 13:
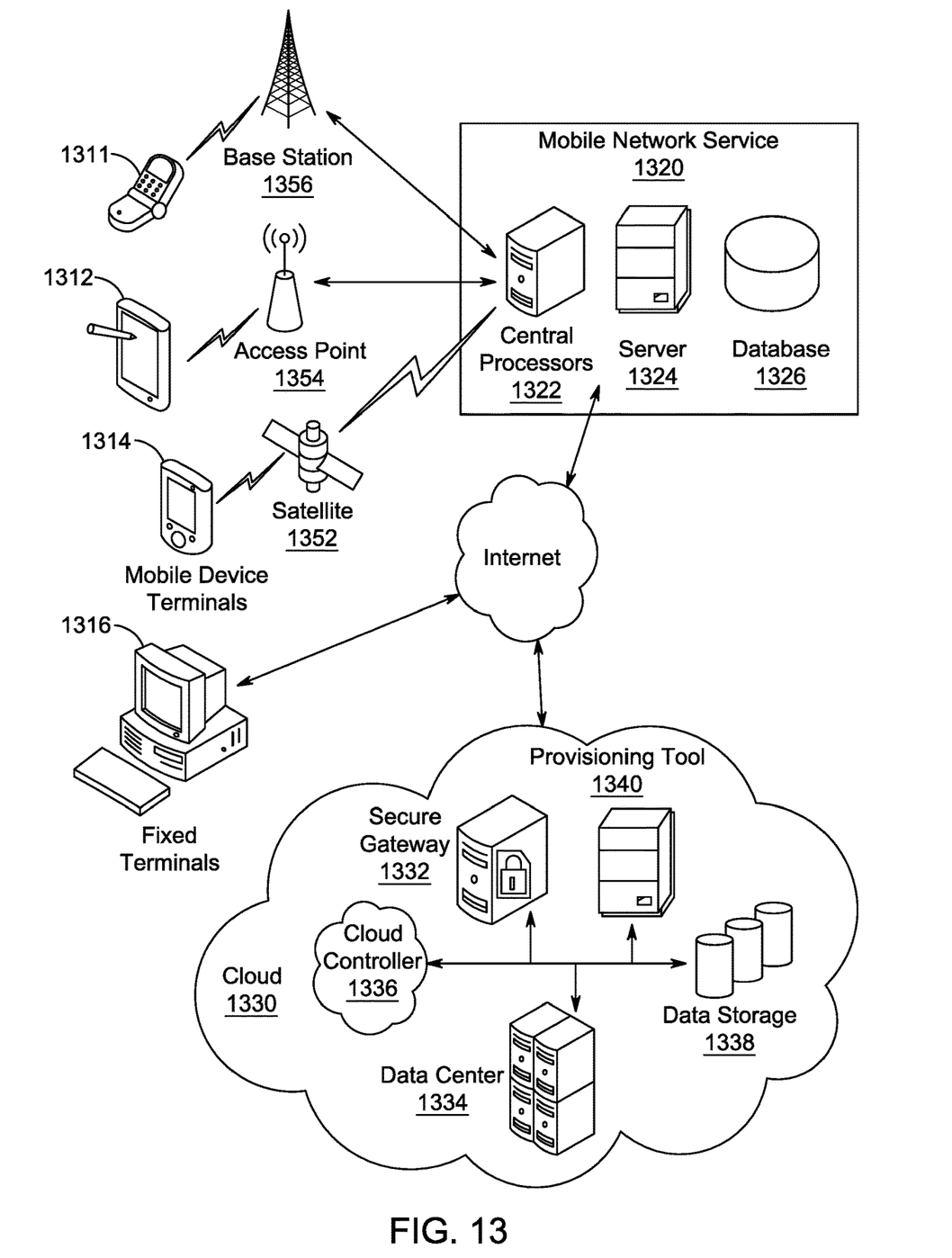
FIG. 13 is an illustration of a non-limiting example of distributed components that may share processing with the controller, according to aspects of the present disclosure.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 13, in addition to various human interface and communication devices (e.g., display monitors, smart phones, tablets, personal digital assistants (PDAs)). More specifically, FIG. 13 illustrates client devices including smart phone 1311, tablet 1312, mobile device terminal 1314 and fixed terminals 1316. These client devices may be commutatively coupled with a mobile network service 1320 via base station 1356, access point 1354, satellite 1352 or via an internet connection. Mobile network service 1320 may comprise central processors 1322, server 1324 and database 1326. Fixed terminals 1316 and mobile network service 1320 may be commutatively coupled via an internet connection to functions in cloud 1330 that may comprise security gateway 1332, data center 1334, cloud controller 1336, data storage 1338 and provisioning tool 1340. The network may be a private network, such as a LAN or WAN, or may be a public network, such as the Internet. Input to the system may be received via direct user input and received remotely either in real-time or as a batch process. Additionally, some aspects of the present disclosures may be performed on modules or hardware not identical to those described. Accordingly, other aspects of the present disclosures are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A fiber optic ring laser, comprising:
   a ring cavity;
   an L-band semiconductor booster optical amplifier (BOA) located in the ring cavity, wherein the L-band BOA includes a gain medium having an InP/InGaAsP multiple quantum well (MQW) structure, wherein the gain medium is configured to receive a drive current and generate a spontaneous emission of photons which form a laser beam;
   a Fiber Fabry Pérot Tunable Filter (FFP-TF) located in the ring cavity and coupled to an output of the L-band BOA, wherein the FFP-TF is configured to receive the laser beam, filter the laser beam to select a wavelength in a range of 1578 nm to 1632 nm and generate a filtered laser beam having the selected wavelength;
   a fiber coupler located in the ring cavity and coupled to an output of the FFP-TF, wherein the fiber coupler is configured to divide the filtered laser beam into a laser beam output and a laser beam retained in the ring cavity;
   an optical isolator (ISO) located in the ring cavity and connected to the fiber coupler, wherein the ISO is configured to receive the retained laser beam and ensure unidirectional operation of the fiber optic ring laser; and
   a polarization controller (PC) located in the ring cavity and coupled to an output of the ISO, wherein the PC is configured to adjust a state of polarization of the retained portion to achieve a stable output power,
   wherein an output of the PC is coupled to an input of the L-band BOA, such that the L-band BOA, the FFP-TF, the optical coupler, the ISO and the PC are coupled to form a ring configuration that implements a continuously tunable booster amplifier-based fiber ring which operates in a tunable wavelength range of 1578 nm to 1632 nm.

2. The fiber optic ring laser of claim 1, wherein the L-band BOA is a single pass traveling-wave type amplifier, capable of amplifying single and multi-wavelength signals.

3. The fiber optic ring laser of claim 2, wherein the L-band BOA has a refractive index of about 3.2.

4. The fiber optic ring laser of claim 2, wherein the L-band BOA is operable to provide about 3 dB gain bandwidth for a range of 80 nm to 90 nm.

5. The fiber optic ring laser of claim 1, wherein the continuously tunable booster amplifier-based fiber ring laser is operable to be continuously tuned over a wavelength range by varying a voltage applied to the FFP-TF, and wherein the wavelength range varies from 1578 nm to 1632 nm.

6. The fiber optic ring laser of claim 5, wherein the continuously tunable fiber ring laser is operable to provide an output laser beam having an output power of about 5.2 dBm and a side mode suppression ratio (SMSR) of about 55 dB.

7. The fiber optic ring laser of claim 1, wherein the fiber coupler provides the output from the continuously tunable booster amplifier-based fiber ring laser, wherein 90% of amplified spontaneous emission (ASE) is fed back to the ring cavity.

* * * * *